United States Patent
Ma

[19]

[11] Patent Number: 5,973,492
[45] Date of Patent: Oct. 26, 1999

[54] HIGH ACCURACY OPTICAL CURRENT TRANSDUCER THTA ELIMINATES BIREFRINGENCE

[76] Inventor: Xianyun Ma, Dept. of Electrical & Computer Engineering, University of South Carolina, Columbia, S.C. 29208

[21] Appl. No.: 08/842,797

[22] Filed: Apr. 16, 1997

[51] Int. Cl.[6] .................. G01R 33/032; G01R 19/00; G02B 6/42
[52] U.S. Cl. .......................... 324/96; 324/117 R
[58] Field of Search .................. 324/96, 117 R, 324/127, 244.1, 753; 359/245, 257; 250/225, 231.1

[56] References Cited

U.S. PATENT DOCUMENTS

| | | |
|---|---|---|
| 3,906,343 | 9/1975 | Feldtkeller . |
| 4,539,521 | 9/1985 | Matsumoto . |
| 5,488,291 | 1/1996 | Koide ........................... 324/96 |

FOREIGN PATENT DOCUMENTS

| | | | |
|---|---|---|---|
| 0049973 | 2/1989 | Japan ........................... | 324/96 |
| 0053169 | 3/1989 | Japan ........................... | 324/96 |

*Primary Examiner*—Jay Patidar
*Attorney, Agent, or Firm*—Michael A Mann; Nexsen Pruet Jacobs & Pollard LLP

[57] ABSTRACT

An improved magneto optical current transducer for measuring electrical current is taught that significantly reduces birefringence resulting from thermal transients and construction-induced stresses. The transducer includes a housing made of a material that readily transfers heat throughout itself. Inside the housing and surrounding the magneto optical material is a buffer made of a material that does not readily tranfer heat from the housing to the magneto optical material, but rather slows its transference to that material material. The buffer material has a thermal expansion coefficient that is preferably very close to that of the magneto optical material, so that when the magneto optical material responds to changes in its temperature by expanding or contracting, the buffer expands with it at very nearly the same rate to avoid stresses. Finally, either spring-loaded elements or resilient material-backed elements are positioned between the housing and the buffer to evenly resist translational movement of the magento optical material but to allow expansion of it so that stresses due to thermal expansion are minimized.

16 Claims, 4 Drawing Sheets

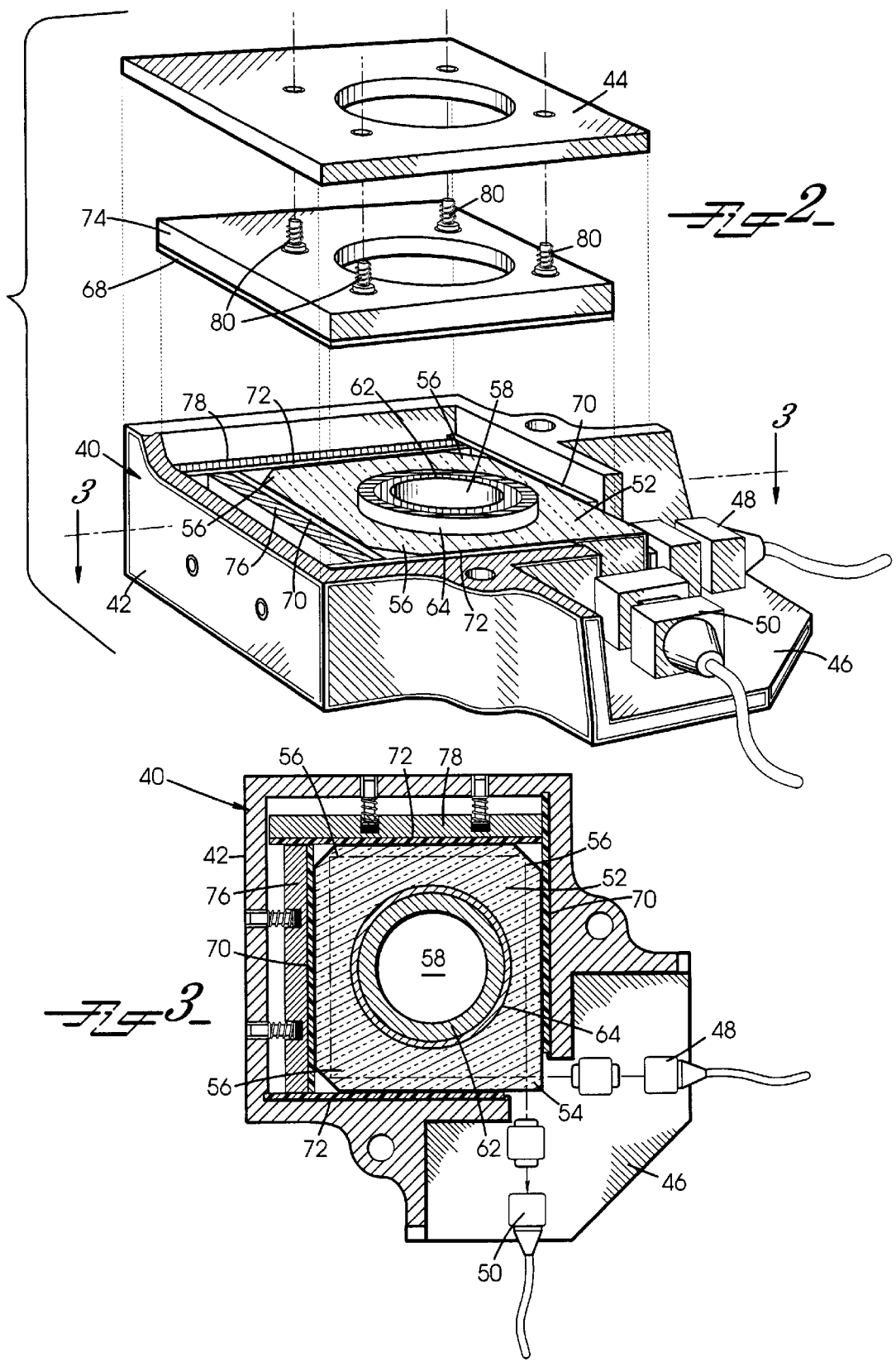

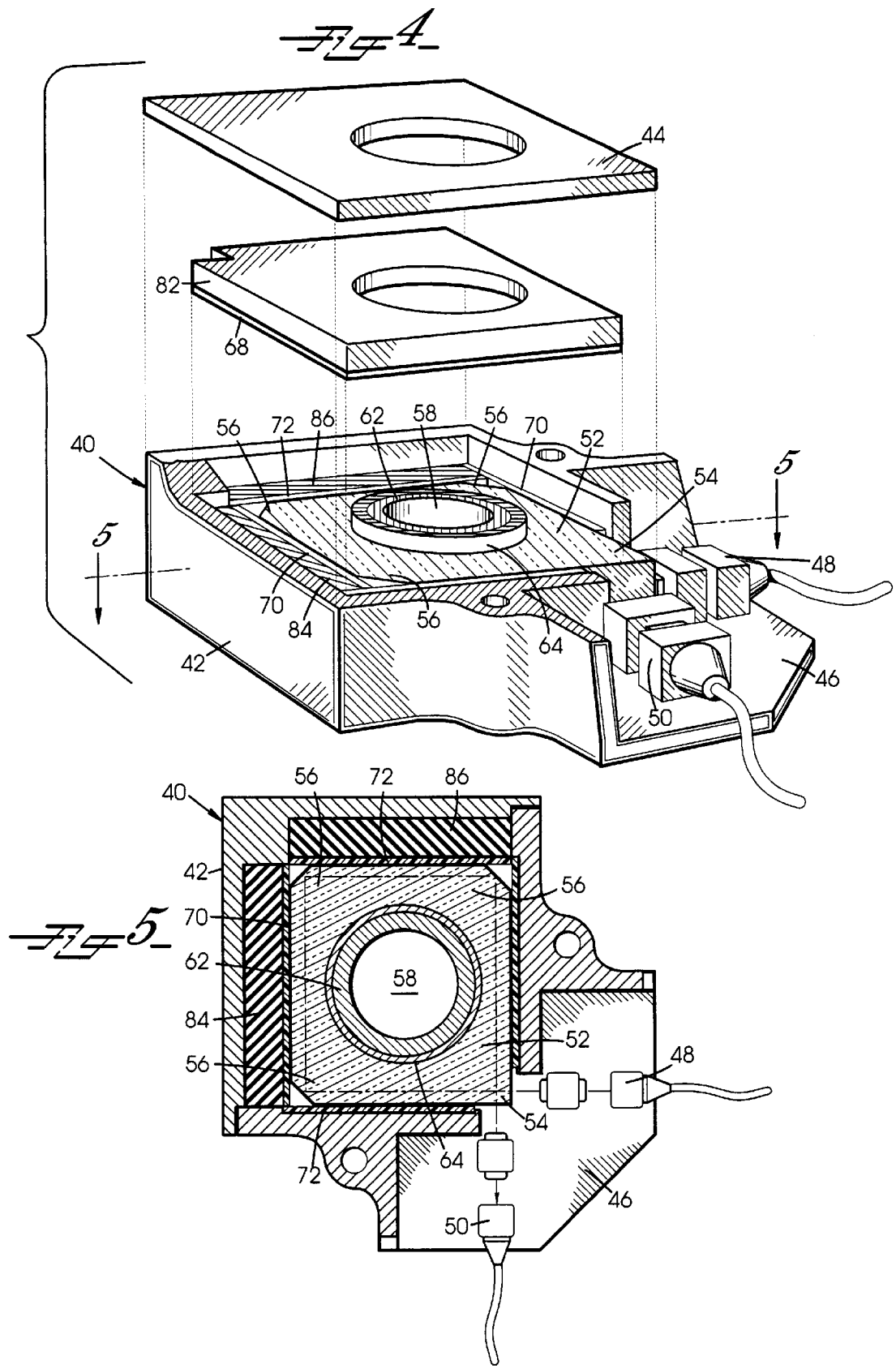

HIGH ACCURACY OPTICAL CURRENT TRANSDUCER THTA ELIMINATES BIREFRINGENCE

BACKGROUND OF THE INVENTION

1. Field of the Invention

The present invention relates to magneto optical current transducers. In particular, the present invention relates to an improvement in the construction of magneto optical current transducers.

2. Discussion of Background

Magneto optical current transducers have been known for a number of years. These particular devices are very useful in measuring current, especially in high voltage lines such as electrical utility power lines. These devices take advantage of the Faraday effect, in which a magnetic field causes a rotation of the plane of polarization of light passing through magento optical material. The strength of the effect is related to the strength of the magnetic field, which in turn is caused by the electrical current flowing through the power line.

Typically, a magneto optical current transducer comprises a light source, a ring of a magneto optical material, a pair of polarizers, and circuit elements to send the light from the source through one of the light polarizers and into the ring, where the light's polarization is shifted by the magnetic field, and then through the second polarizer to detect the degree of polarity shift and analyze it. Examples of such devices are taught by Feldtkeller in U.S. Pat. No. 3,906,343 and Matsumoto in U.S. Pat. No 4,539,521.

The problem with magento optical current transducers is their accuracy. There are several sources of error traceable to birefringence in the glass sensor of the transducer. Birefringence is defined as the splitting of a beam of light into two components that each travel at a different speed. Birefringence can result from the construction of the device and from thermal transients. Both may result in stresses in the magento optical material that will result in birefringence.

The value of accuracy in current measurement cannot be overstated. The current and voltage—both of which can be measured by magneto optical current transducers—relate to energy supplied and billing for electric power service. They can reflect the electrical load used by customers. If electrical power is wheeled from utility service district to service district accounting for its value requires careful measurement.

There remains a need for better magneto optical current transducers.

SUMMARY OF THE INVENTION

According to its preferred embodiments and briefly stated, the present invention is an improvement in the construction of a magneto optical current transducer. The improved transducer comprises a housing containing a sensor surrounded by a buffer. The buffer is made of a material having a substantially lower heat transfer coefficient compared to that of the housing and having thermal expansion not substantially higher than and preferably lower than that of the sensor, and a thermal expansion coefficient substantially the same as that of the sensor. The buffer and sensor are held in position in the housing in part by retainers that allow expansion of the sensor and buffer as a result of temperature changes but resist translational movement.

The use of a buffer having the requisite heat transfer coefficint and thermal expansion coefficient is an important feature of the present invention. Because of its low heat transfer coefficient, it slows the rate of heat transfer to the sensor material and thereby prevents rapid changes in the geometry of the sensor during periods of rapidly changing temperature. Because its thermal expansion coefficient is not significantly higher than that of the sensor and is preferably lower, mechanical stresses resulting from a different rate of thermal expansion that would otherwise compromise the accuracy of the transducer are avoided or minimized.

Another important feature of the present invention is the use of the retainer, preferably in the form of a spring mechanism or resilient material placed between the housing and the buffer to equalize forces on the sensor. The retainer also minimizes or avoids mechanical stresses on the sensor glass by holding it in position resisting translational movements of the sensor (and buffer), but not so rigidly that expansion or contraction from temperature changes is opposed.

Finally, using a housing having good heat transfer characteristics assures that heat applied to one side of the housing is transferred evenly and rapidly over the entire surface of the housing before significant heat is tranferred by the buffer to the sensor. Even heat distribution assures that the temperature gradients across the sensor are minimized and uniform.

BRIEF DESCRIPTION OF THE DRAWINGS

In the figures,

FIG. 2 is a perspective, partially exploded, partially cut-away view of a magneto optical current sensor, according a preferred embodiment of the present invention;

FIG. 3 is a top, cross-sectional view of the sensor of FIG. 2 taken along lines 3—3.

FIG. 4 is a perspective, partially exploded, partially cut-away view of a magneto optical current sensor, according to another preferred embodiment of the present invention;

FIG. 5 is a top, cross-sectional view of the sensor of FIG. 4 taken along lines 4—4;

DETAILED DESCRIPTION OF PREFERRED EMBODIMENTS

Figure 1:
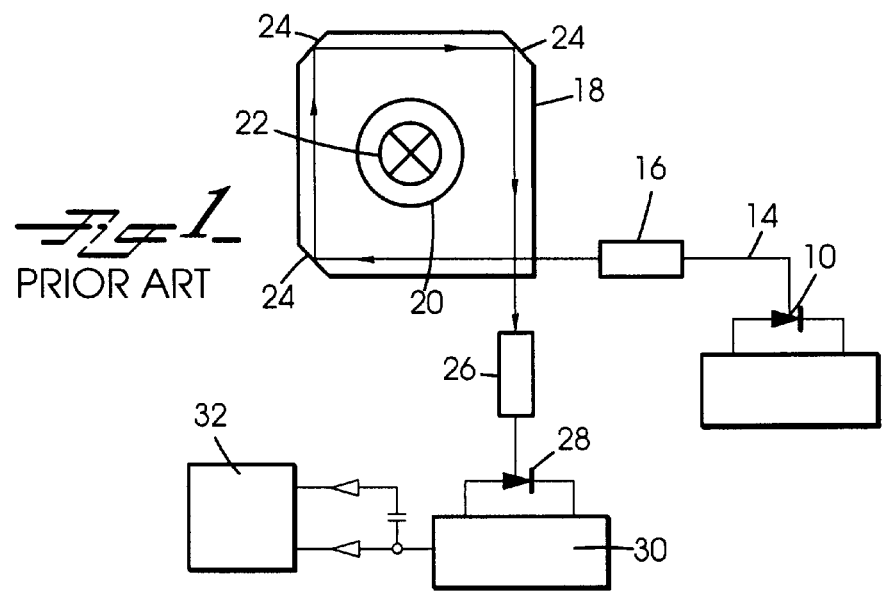
FIG. 1 is a schematic view of a typical apparatus employing a magneto optical current sensor.

The present invention is a magneto optical current transducer. Specifically, it is an improvement in the construction of magneto optical current transducers (MOCTs) that avoids or minimizes the birefringence caused by thermal transients and construction-caused birefringence, which is a significant source of error in prior art MOCTs.

Compared to conventional oil-filled electrical current transformers (CTs), optical current transducers (OCTs) which usually use the Faraday effect (and are commonly referred to as Magneto Optical Current Transducers or MOCTs) have many advantages: a simpler insulation structure, immunity to electromagnetic interference, wider dynamic range and bandwidth, greater safety, and smaller size and weight. They are considered to be an optimum interface between high voltage lines and electronic equipment that monitors and controls power systems. However, temperature and stress-induced linear birefringence in the sensor material causes error and instability, and thus severely limits the practical applications of MOCTs.

Although the kind of MOCT that uses bulk glass as a sensing material has been intensively investigated in recent years, its performance is also limited by the presence of birefringence caused by temperature changes. The temperature dependence of the sensitivity of MOCT may be corrected by using external temperature measurements at the sensing head. However, this method increases complexity and cost. Special complex signal-processing techniques for eliminating the birefringence effect have been developed, but these approaches have apparently not been incorporated into commercial products. The limitation of these methods is that the birefringence in sensing material is assumed to be uniform, which might not be perfectly satisfied in situ. These methods fail to resolve the birefringence caused by thermal shock or uneven temperature distribution.

In fact, the problem of stress-induced linear birefringence caused by temperature changes is very complicated. Different MOCTs have different birefringence effects. Using MOCT with a glass ring sensor head (using dual quadrature reflection to eliminate the reflection-induced phase difference), the present MOCT is a novel birefringence-eliminating design that has a high degree of accuracy over a very wide temperature range without requiring temperature-compensating signal analysis.

It is known that birefringence in glasses can originate from residual internal stresses that depend on the thermal history of the material or from temporary internal stresses arising from temperature transients resulting from environmental temperature changes. It is also known that the temporary internal stresses are strongly dependent on the condition of the glass such that differences in the construction of the sensor will result in differences in the temporary internal birefringence. Therefore, the linear birefringence in MOCTs can be classified into three types: (1) residual birefringence remaining after manufacture of the Faraday material, which can be neglected after careful annealing; (2) temporary stress birefringence cause by environmental temperature variations; and (3) construction birefringence caused by construction of the sensor. For example, if the sensing glasses are glued to the datum plane, inevitably greater construction stresses result. Note that construction birefringence is usually also related to temperature changes.

A MOCT with a glass ring sensor head usually uses "SF6" glass as a sensing material because of its relatively high Verdet coefficient and low temperature dependency. SF6 is a designator known to those familiar with glasses, especially those familiar with MOCT glasses. SF6 glass, sometimes call Schott SF6, typically contains 27% $SiO_2$, 71% $PbO_2$ and 1% $K_2O$, 0.5% $Na_2O$ and 0.3% $As_2O_3$. Improper construction of the sensor increases the effect of temperature transients on the MOCT's output.

Temporary stress birefringence will disappear completely after a long enough time. Its time constant is about 30 minutes and varies with sensor size and material properties. Because it varies with the relatively long thermal history of the MOCT, it is not practical to compensate for temporary stress birefringence by an external temperature measurement.

Different thermal histories and variations in the construction of sensors will induce different stress-related birefringence effects, which are usually not uniform and are difficult to compensate for by assuming uniform birefringence distribution.

In practical terms, the linear birefringence of a MOCT is nearly always much larger than the Faraday rotation angle. Hence, if the linear birefringence is less than 8.8°, the MOCT can reach an accuracy of plus or minus 0.2% with no compensation birefringence.

To eliminate birefringence, the sensor must be constructed properly. Ideal construction will eliminate temporary birefringence and cancel completely the construction-caused birefringence. To eliminate temporary birefringence, the temperature gradient in the sensor must be decreased and be kept as uniform as possible. Uniformity in the gradient is established by making certain that the temperature distribution over the sensor is as uniform as possible. Reduction of the gradient results when the rate of heat transfer between the sensor material and its surroundings is slowed. If both are done by careful construction and choice of materials, according to the present invention, a 0.2% accuracy level can be achieved.

To eliminate construction-caused birefringence, the present invention incorporates flexible retainers that resist translational movement of the sensing material but permit its expansion and contraction as a result of environmental temperature changes. These retainers greatly reduce construction-caused birefringence.

The key features of the present MOCT are then (1) a housing made of a rigid, protective material having a relatively high heat transfer coefficient, such as aluminum; (2) buffers having relatively low heat transfer coefficients compared to the housing but comparable to the sensor's, and having thermal expansion coefficients that are not significantly different than the thermal expansion coefficients of the sensor material; and (3) retainers that distribute force against the buffers and sensor to keep them in position, that is, resist translational movement of the sensor and buffers, but allow them to expand or contract in response to changes in temperature. Preferably these retainers are spring-loaded members or members combined with a layer of a resilient material such as rubber. These retainers substitute for glues or other fixed modes of attachment of the sensor within the housing. Additionally, heat insulating material should be used between the electrical conductor and the sensor, and the orientation of the sensor should preferably take advantage of the buffers so that gravity assists them in maintaining the position of the sensor in the housing.

A MOCT made according to the present invention largely eliminates both transient and construction-related birefringence and also has its own advantages. For example, the present MOCT has smaller changes on optical intensity output; its main parts are more easily removable, and it has good performance against heat shock.

In a practical MOCT with a glass ring sensor head using dual-quadrature reflection to eliminate the reflection-induced phase difference, the housing is made of aluminum, which is a good heat conductor and has a sensor of SF6 glass. The buffer is also made of 3 mm SF6 glass because its thermal expansion coefficient satisfies perfectly the conditions of the ideal sensor, and it also has a substantially lower thermal transfer coefficient compared to the aluminum. The retainers can either employ rubber or spring-loaded screws against a bracing member to equalize the forces against the buffers and sensor.

As showin in FIG. 1, the principle of the MOCT current measuring apparatus is that a source of light, preferably kept at constant temperature and wavelength, such as a light-emitting diode (LED) 10 with a well-regulated current from a power source flowing through it, directs its light through an optic fiber 14 to a first polarizer 16. Polarizer 16 linearly polarizes the light received from LED 10 and directs it into a sensor 18.

Sensor 18 has a hole 20 formed in it that is dimensioned to receive a electrical current-carrying conductor 22. The light from polarizer 16 enters sensor 18 near one corner and is transmitted or conducted along one side, then repeatedly reflected by angled corners 24 until it has encircled hole 20 and emerges at the same corner it entered.

When the light emerges, it enters a second polarizer 26, often called an analyzer, that is rotated by 45° from first polarizer 16. Because the Faraday material of sensor 18 will cause a rotation of the plane of polarization of the entering light when an electrical current is flowing through conductor 22—a rotation proportional to the amount of current in conductor 22—second polarizer 26 converts the rotation of the polarized light to an intensity modulated at the frequency of the current in conductor 22.

The intensity of the light output of second polarizer 26 is detected by a photodiode 28 or other light intensity sensor and amplified by a pre-amplifier 30. To normalize the signal, the AC-part is divided by the DC-part, and then it is fed into a computer 32 for analysis.

In the event heat is applied to part of the MOCT, the aluminum housing readily transfers the heat to all parts of the housing. Inside, the buffers slow the rate of heat transfer to the sensor. The relatively low heat transfer coefficient of the buffers compared to the relatively high heat transfer coefficient of the housing assures that the temperature throughout the housing is uniform following the application of heat to one side before significant heat is transfered from the housing material to the buffer.

Temperature gradients in the sensor are also minimized when the buffer has a thermal transfer coefficient not significantly different than that of the sensor material, so that as soon as the temperature of the buffer begins to rise or fall, the temperature of the sensor follows without significant gradient at the boundary between the two. By this relationship in their respective thermal transfer coefficients, temperature gradients are kept both uniform and minimal. Thus, temporary birefringence is reduced or eliminated.

FIGS. 2–5 illustrate partially exploded, partially cut-away views and top cross-sectional views of two embodiments of the present MOCT. Regarding the construction of the present invention, housing 40 has a base 42 and a top 44. Base 42 has a stage 46 for fixing a first and a second polarizer 48, 50, respectively to it in such a way that they are positioned to direct light into and receive light from, respectively, a sensor 52. A corner 54 of sensor 52 is exposed at stage 46. Otherwise housing 40 covers all other portions of sensor 52, which is in the shape of a parallelopiped having a square cross section when viewed from one side and a rectangular cross section when viewed from the other two sides. Three of its corners 56 are angled to reflect light from first polarizer 48 throughout its interior so that light reemerges from sensor 52 at stage 46 and enters second polarizer 50.

A hole 58 is formed in the center of sensor 52 to receive the electrical conductor (not shown). Hole 58 is lined with an aluminum cylinder 62 and, radially inward from there, a first buffer 64 made of a good thermal insulator such as cotton, to greatly reduce heat transfer across the boundary defined by hole 58.

In addition to first buffer 64 lining the inside of hole 58, sensor 52 has a second, a third and a fourth buffer pairs 68, 70, 72, respectively, on its top and bottom and peripheral sides, respectively. Buffer pair 68 covers the top and bottom of sensor 52; buffer pair 70 covers two opposing peripheral sides of sensor 52; buffer pair 72 covers the remaining two opposing peripheral sides of sensor 52. Second, third and fourth buffer pairs 68, 70, 72 are preferably made of SF6 glass because its thermal expansion coefficient is the same as the material of the sensor (also SF6 glass) and because its thermal expansion coeffient is not significantly different, according to the criteria for the present MOCT construction; it is, in fact, the same as the sensor 52's coefficient of thermal expansion.

On the bottom and two of the four peripheral sides of sensor 52, it simply rests against one buffer of each of the three buffer pairs 68, 70, and 72, without glues or other fixed, rigid attachment. Another advantage of using SF6 glass as both a buffer and the sensor is that it slides relatively easily on itself. On the top and the two remaining of the four peripheral sides of sensor 52, it rests against the remaining buffer of second, third and fourth buffers 68, 70, and 72, respectively, again without glues or other attachment, but is spaced apart from housing 40.

In that space between housing 40 and buffers 68, 70, and 72 are retainers that prevent translational movement of sensor 52 but allow it to expand as a result of changes in its temperature. Two such means are shown: spring-loaded screws (FIGS. 2 and 3) and resilient layer such as one made of rubber (FIGS. 4 and 5).

In FIGS. 2 and 3, buffer pairs 68, 70, and 72 are held in place by braces 74,76, and 78, respectively, which are loaded by a spring system comprised of a plurality of springs 80 loaded against housing 40. Expansion of sensor 52 and buffer pairs 68,70, and 72 is absorbed by compression of springs 80, but translational movement is limited (unless the MOCT is dropped for example). Braces may be made of aluminum for good heat transfer.

In FIGS. 4 and 5, in the space between housing 40 and buffers 68, 70, and 72 are positioned layers 82,84, and 86 of a resilient material such as rubber. The rubber absorbs expansion of sensor 52 and buffer pairs 68, 70, and 72 but limits translational movement.

Housing 40 is preferably made of a material with a relatively high heat transfer coefficient, such as a metal or metal alloy, most preferably of aluminum for its strength, low cost, and high heat transfer coefficient. Buffer pairs 68, 70 and 72 are preferably made of SF6 glass because it has a substantially lower heat transfer coefficient than housing 40, a heat transfer coefficient not substantially higher than sensor 52, and substantially the same thermal expansion coefficient as the sensor. The greater the ratio of heat transfer coeffients of housing to buffer, the more quickly heat will be tranmitted throughout the housing before substantial heat is tranferred by the buffer. The slower the heat is transferred to the sensor, the better for error reduction. As long as it is not tranferred to the sensor in such a way that gradients are minimized, error will be reduced. Finally, the thermal expansion coefficients of the sensor and buffer should be as close as possible, so that mechanical stress caused by the buffer's expansion and contraction is minimized The MOCT illustrated in FIGS. 2–5 is preferably oriented so that stage 46 is pointing down so that gravity is uniformly assisting two of the peripheral sides of housing 40 in preventing translational movement.

Figure 6:
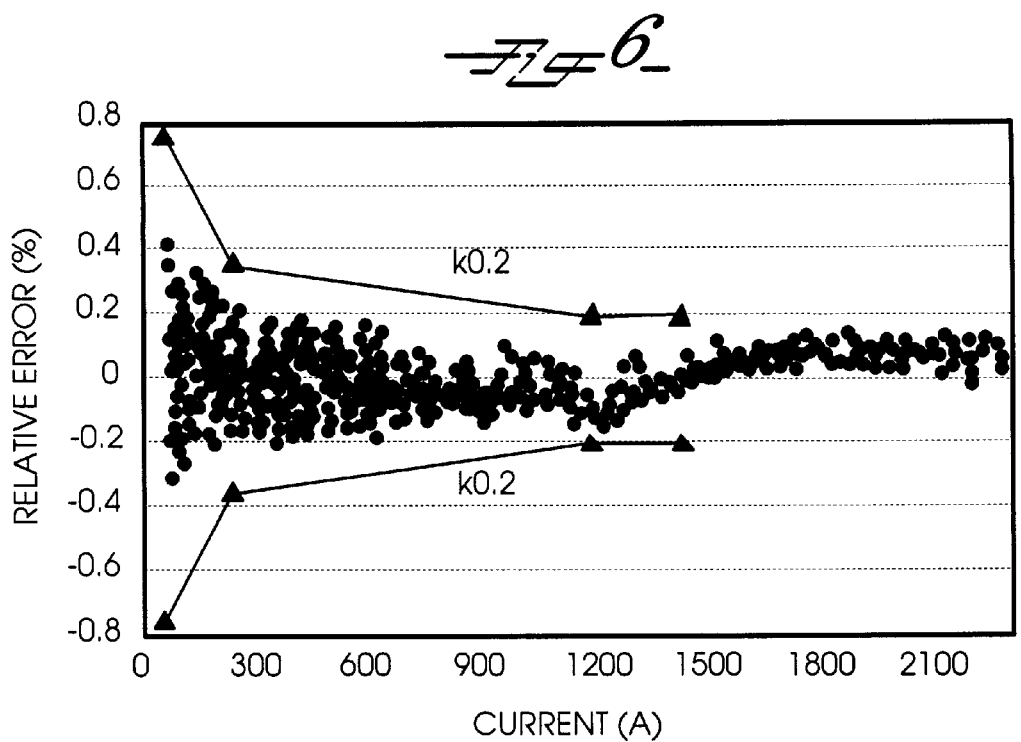

A MOCT made according to the present design was tested. FIG. 6 shows the relative error of the MOCT tested on a current loop capable of generating 50 Hz constant current up to 3 KA. The current was varied from 70 to 2400 A and was measured with both a MOCT according to the present design and a conventional class 0.1 current transformer. The rms current was calculated from the three phases. The results show that the relative error was better than class 0.2 current transformer requirements for amplitude errors (at a rated current of 1200 A). Less than 0.5° of phase error was observed over the above current range. The larger error at low currents is believed to be due to the noise of the photodiode.

Figure 7:
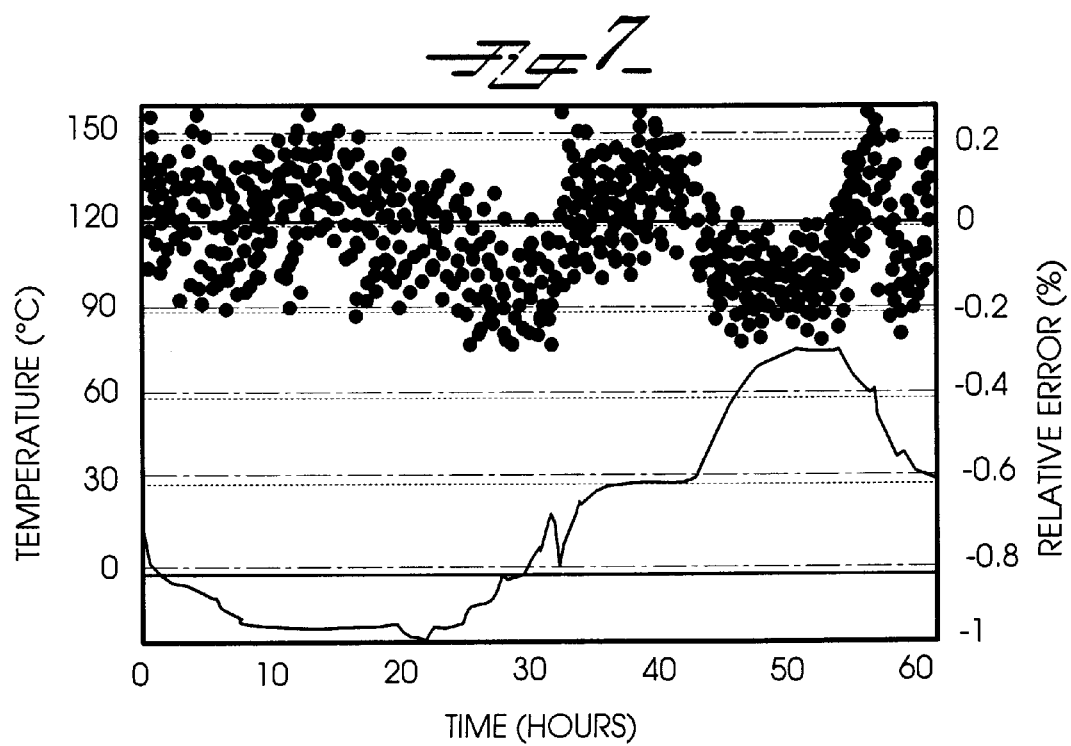

FIG. 7 shows the temperature performance of the MOCT while keeping the current in the range of 250–400 A. The high temperature was produced using an oven; low temperature was produced using a refrigerator. Both were controlled manually. The experimental results illustrate that the temperature performance of the MOCT depends strongly on the rate at which temperature changes, not just on the absolute magnitude of the temperature. Thus FIG. 7 includes time as a variable.

In the temperature range of 30–70° C., when the temperature was changed at the rate of 8° C./hour and when there was also a 20° C. temperature shock, the relative error was better than plus or minus 0.3% and the change in output optical intensity was less than plus or minus 12%. Furthermore, the MOCT was not damaged as the result of temperature shocks ranging from 20° C. to 70° C.

Figure 8:
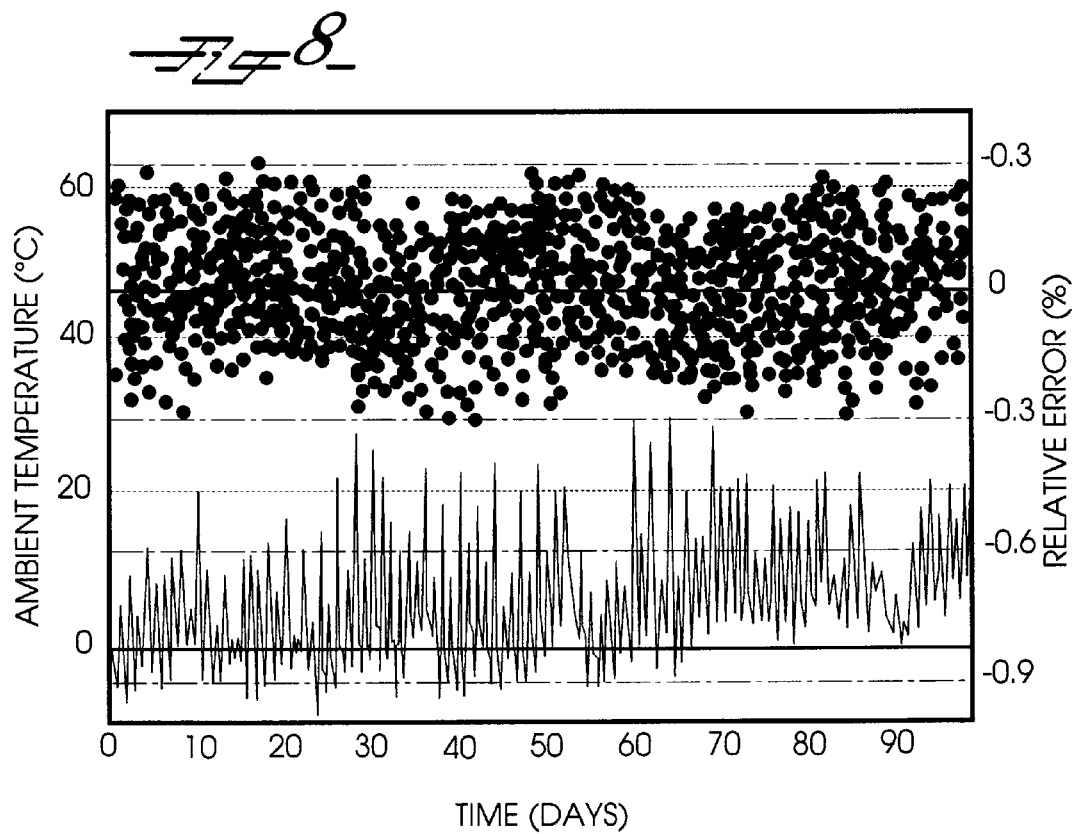
FIGS. 6–8 are graphs illustrating the results of tests performed on a magneto optical current sensor made according to a preferred embodiment of the present invention.

In FIG. 8 the results of 100 days of similated field testing are illustrated. The MOCT was placed out of doors and subjected to currents of 200–600 A. At five-minute intervals the output signal was recorded, along with optical intensity, current and the temperatures of the ambient air, sensor, LED and photodiode. As can be seen from FIG. 8, the error at less than 0.3%, is due primarily to daily temperature changes but is not due to long-term temperature effects.

It will be apparent to those skilled in the art of magneto optical current transducers that many changes and substitutions can be made in the preferred embodiments described above without departing from the spirit and scope of the present invention, which is defined by the appended claims.

What is claimed is:

1. A magneto optical current transducer, comprising:
   a housing;
   a sensor within said housing, said sensor formed with a hole therein and having a heat transfer coefficient, said hole dimensioned for receiving an electrical current-carrying conductor;
   a buffer layer carried within said housing and surrounding said sensor, said buffer layer made from a material having a low heat transfer coefficient so that said buffer uniformly slows the transfer of heat to and from said sensor, said buffer layer having a thermal expansion coefficient substantially the same as the thermal expansion coefficient of said sensor; and
   a resilient layer carried within said housing, said resilient layer positioned between said housing and said buffer layer, said resilient layer allowing thermal expansion of said sensor and said buffer layer but resisting translational movement of said sensor and said buffer.

2. The transducer as recited in claim 1, wherein said housing is made of a material having a heat transfer coefficient that substantially exceeds the heat tranfer coefficient of said buffer so that heat applied to said housing is transferred throughout said housing before significant heat is transferred through said buffer.

3. The transducer as recited in claim 1, wherein said housing is made of a material selected from the group consisting of metals and metal alloys.

4. The transducer as recited in claim 1, wherein said housing is made of aluminum.

5. The transducer as recited in claim 1, further comprising a spring system positioned between said housing and said buffer for allowing thermal expansion of said sensor and said buffer but resisting translational movement of said sensor and said buffer.

6. A magneto optical current transducer, comprising:
   a housing;
   a sensor within said housing, said sensor formed with a hole therein and having a heat transfer coefficient, said hole dimensioned for receiving an electrical current-carrying conductor;
   a buffer layer carried within said housing and surrounding said sensor, said buffer layer made from SF6 glass; and
   means carried within said housing and positioned between said housing and said buffer layer for allowing thermal expansion of said sensor but resisting translational movement of said sensor.

7. The transducer as recited in claim 6, wherein said allowing means is a resilient layer.

8. The transducer as recited in claim 6, wherein said allowing means is a spring system.

9. The transducer as recited in claim 6, wherein said housing is made of a material selected from the group consisting of metals and metal alloys.

10. The transducer as recited in claim 6, wherein said sensor has a thermal expansion coefficient, and wherein said transducer further comprises a buffer surrounding said sensor and positioned within said housing, said buffer having a thermal expansion coefficient substantially the same as the thermal expansion coefficient of said sensor.

11. Apparatus for measuring the magnitude of an electrical current carried by an electrical conductor, said apparatus comprising:
   a source of light;
   a first polarizer positioned to receive light from said source of light;
   a housing;
   a magneto optic material in said housing and having a hole formed therein dimensioned for receiving an electrical conductor therethrough, said magneto optical material positioned to receive polarized light from said first polarizer and to conduct light through itself around said hole;
   a buffer layer carried within said housing and surrounding said magneto optic material, said buffer layer made from a material having a low heat transfer coefficient so that said buffer slows the transfer of heat to and from said magneto optic material, said buffer layer having a thermal expansion coefficient substantially the same as the thermal expansion coefficient of said magneto optic material;
   a resilient layer carried within said housing, said resilient layer positioned between said housing and said buffer layer, said resilient layer allowing thermal expansion of said magneto optic material and said buffer layer but resisting translational movement of said magneto optic material and said buffer;
   a second polarizer positioned to receive light that has been conducted around said hole from said magneto optical material;
   photodiode positioned to receive light from said second polarizer, said photodiode converting received light to an electrical signal; and means for processing said electrical signal to determine the magnitude of an electrical current carried by said electrical conductor.

12. The apparatus as recited in claim 11, wherein said allowing means is a spring system.

13. The apparatus as recited in claim 11, wherein said housing is made of a material selected from the group consisting of metals and metal alloys.

14. The transducer as recited in claim 11, wherein said housing is made of aluminum.

15. The apparatus as recited in claim 11, wherein said buffer layer is made from SF6 glass.

16. The magneto optical current transducer as recited in claim 1, wherein said buffer layer is made from SF 6 glass.

* * * * *